(12) United States Patent
Tsukahara et al.

(10) Patent No.: US 8,033,882 B2
(45) Date of Patent: Oct. 11, 2011

(54) LIGHT-EMITTING DEVICE OR DISPLAY DEVICE, AND METHOD FOR PRODUCING THEM

(75) Inventors: Jiro Tsukahara, Kanagawa (JP); Mitsuru Sawano, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 320 days.

(21) Appl. No.: 12/209,984

(22) Filed: Sep. 12, 2008

(65) Prior Publication Data
US 2009/0072735 A1  Mar. 19, 2009

(30) Foreign Application Priority Data

Sep. 19, 2007 (JP) ................................ 2007-242716
May 22, 2008 (JP) ................................ 2008-134080

(51) Int. Cl.
*H05B 33/00* (2006.01)

(52) U.S. Cl. ......................................... 445/24; 313/512

(58) Field of Classification Search .................. 313/504, 313/506, 512, 511; 445/24, 25
See application file for complete search history.

(56) References Cited

U.S. PATENT DOCUMENTS

| 6,522,067 | B1 * | 2/2003 | Graff et al. ..................... 313/512 |
| 2003/0213956 | A1 | 11/2003 | Hioki et al. |
| 2004/0046497 | A1 | 3/2004 | Schaepkens et al. |
| 2004/0141141 | A1 | 7/2004 | Ota et al. |
| 2004/0195962 | A1 * | 10/2004 | Nakamura et al. ............ 313/504 |
| 2007/0048895 | A1 | 3/2007 | Suginoya et al. |

FOREIGN PATENT DOCUMENTS

| EP | 1 424 739 A2 | 6/2004 |
| JP | 64-89178 A | 4/1989 |
| JP | 2004-79432 A | 3/2004 |
| JP | 2005-63976 A | 3/2005 |

* cited by examiner

*Primary Examiner* — Karabi Guharay
(74) *Attorney, Agent, or Firm* — Birch, Stewart, Kolasch & Birch, LLP

(57) ABSTRACT

A light-emitting device or a display device comprising a resin film or a resin layer, a glass substrate, a light-emitting element laminate or a display element laminate, and a gas-barrier film in that order. The device is thin and hardly broken.

1 Claim, 1 Drawing Sheet

LIGHT-EMITTING DEVICE OR DISPLAY DEVICE, AND METHOD FOR PRODUCING THEM

BACKGROUND OF THE INVENTION

1. Field of the Invention

The present invention relates to a light-emitting device or a display device, and to a method for producing them.

2. Description of the Related Art

Heretofore investigated is use of a glass substrate and a gas-barrier film in an organic EL device (organic electroluminescent device). For example, JP-A 2004-79432 describes use of a transparent gas-barrier film comprising an ultra-thin glass sheet and a transparent resin layer as a sealant for organic EL devices. JP-A 2005-63976 describes an organic EL device having a glass substrate and a panel-protective film. The organic EL device protects it from water penetration thereinto by a cap.

SUMMARY OF THE INVENTION

However, the glass substrate is problematic in that it may be often broken. In case where the glass substrate is desired to be hardly broken, it must be thick, which, however, is problematic in that the device comprising such a thick substrate is inevitably thick. When a cap is used as in JP-A 2005-63976, then a space is formed between the cap and the light-emitting element laminate or the display element laminate. The space also increases the thickness of the device. As a trial of producing a device not using a glass substrate, use of a gas-barrier film as a substitute for a glass substrate is investigated, which, however, is problematic in that the dimensional accuracy in the process of device production is worsened.

The present invention is to solve the above-mentioned problems and to provide a light-emitting device or a display device that is thin and is hardly broken though comprising a glass substrate.

Given that situation, the present inventors have assiduously studied and, as a result, have found that the above problems can be solved by the following means.

(1) A light-emitting device or a display device comprising a resin film or a resin layer, a glass substrate, a light-emitting element laminate or a display element laminate, and a gas-barrier film in that order.

(2) The light-emitting device or the display device of (1), wherein the resin film or the resin layer has a circular-polarizing function.

(3) The light-emitting device or the display device of (1), wherein the resin film or the resin layer has a light-diffusing function.

(4) The light-emitting device or the display device of any one of (1) to (3), wherein the thickness of the glass substrate is from 100 µm to 300 µm.

(5) The light-emitting device or the display device of any one of (1) to (4), which has an adhesive layer between the light-emitting element laminate or the display element laminate and the gas-barrier film.

(6) The light-emitting device or the display device of any one of (1) to (5), wherein the gas-barrier film has an adhesive layer.

(7) The light-emitting device or the display device of any one of (1) to (6), which has an adhesive layer between the resin film and the glass substrate.

(8) The light-emitting device or the display device of any one of (1) to (7), wherein the thickness of the resin film or the resin layer is from 10 to 1000 µm.

(9) The light-emitting device or the display device of any one of (1) to (8), which has a smooth layer between the glass substrate and the light-emitting element laminate or the display element laminate.

(10) The light-emitting device or the display device of (9), wherein the thickness of the smooth layer is from 0.5 to 10 µm.

(11) The light-emitting device or the display device of any one of (1) to (10), wherein the thickness unevenness of the glass substrate is at most 100 µm.

(12) The light-emitting device or the display device of any one of (1) to (11), wherein the gas barrier film has at least one organic region and at least one inorganic region on the substrate film.

(13) The light-emitting device or the display device of any one of (1) to (12), which is an organic EL device.

(14) A method for producing a light-emitting device or a display device of any one of (1) to (13), which comprises sticking a resin film and a glass substrate together, etching a part of the glass substrate, and providing a light-emitting element laminate or a display element laminate on the glass substrate after etching.

(15) A light-emitting device or a display device produced by the method of (14).

The invention has made it possible to provide a light-emitting device or a display device that is thin and is hardly broken.

In particular, in the invention, a film is stuck to a glass substrate and then this is etched, and therefore, the etching operation is easy. Specifically, when etching a glass substrate alone is tried, then the glass substrate is readily broken and the etching operation must be effected accurately and carefully. However, the invention is free from the problem. In case where a device that has been constructed in some degree is etched, it may be readily etched when the structure has an empty cell as in a liquid-crystal display device; however, a device that could be etched only after a light-emitting element laminate has been incorporated thereinto as in an organic EL device is problematic in that the light-emitting element device maybe deteriorated during etching. To that effect, the process of etching a device that has been constructed in some degree involves many problems. The invention solves all these problems and is therefore extremely advantageous in this point.

BRIEF DESCRIPTION OF DRAWINGS

In FIG. 1, 1 is resin film, 2 is glass substrate, 3 is light-emitting element laminate or display element laminate, and 4 is gas-barrier film.

BEST MODE FOR CARRYING OUT THE INVENTION

Figure 1:
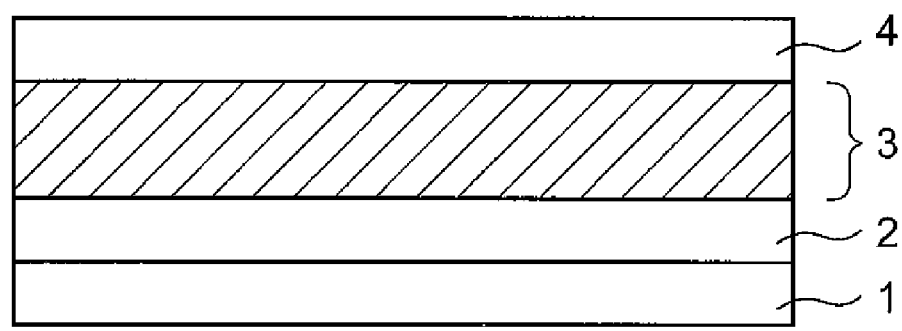
FIG. 1 is an outline view showing one example of a light-emitting device or a display device of the invention.

The contents of the invention are described in detail hereinunder. In this description, the numerical range expressed by the wording "a number to another number" means the range that falls between the former number indicating the lowermost limit of the range and the latter number indicating the uppermost limit thereof. The organic EL device in the invention means an organic electroluminescent device.

<<Layers and Materials for the Light-Emitting Device and the Display Device>>

The light-emitting device or the display device of the invention is characterized by comprising a resin film or a resin layer, a glass substrate, a light-emitting element laminate or a display element laminate, and a gas-barrier film in that order. The light-emitting device or the display device of the invention is described hereinunder with reference to the drawing. Needless-to-say, the light-emitting device or the display device of the invention should not be limited to the illustrated one.

FIG. 1 shows an outline view of a light-emitting device or a display device of the invention, in which 1 is a resin film or a resin layer, 2 is a glass substrate, 3 is a light-emitting element laminate or a display element laminate, and 4 is a gas-barrier film.

In the invention, a resin film or a resin layer 1 is combined with a glass substrate 2, and therefore, even through the glass substrate is thin, the device is hardly broken during etching operation. Accordingly, the invention is extremely advantageous. As a sealant in the invention, a gas-barrier film 4 is used; and therefore, the device of the invention may be thinner as compared with a device sealed with a cap or the like. In the invention, the light-emitting element laminate or the display element laminate is a core part of the light-emitting device or the display device of the invention, and in general, it is a laminate of a pair of electrode layers and an organic compound layer or the like disposed between the electrode layers.

The light-emitting device or the display device of the invention may have any other layer constitution than the above; and for example, one other embodiment additionally has an adhesive layer between the light-emitting element laminate or the display element laminate 3 and the gas-barrier film 4, and/or between the resin film 1 and the glass substrate 2. In this, the gas-barrier film or the resin film is preferably an adhesive layer-having one, as simplifying the production process of the device of the type. Also preferably, a smooth layer is provided between the glass substrate 2 and the light-emitting element laminate or the display element laminate 3. Also preferably a passivation layer is provided between the light-emitting element laminate or the display element laminate 3 and the gas-barrier film 4.

(Resin Film or Resin Layer)

The resin film or the resin layer in the invention comprises a resin as the main ingredient thereof, and it may be a filmy sheet stuck to the substrate, or a resin composition or the like may be applied thereto to form a layer on the substrate. The material of the resin film or the resin layer is not specifically defined. For example, the material includes a polyester resin, a methacrylic resin, a methacrylic acid/maleic acid copolymer, a polystyrene, a transparent fluororesin, a polyimide resin, a fluoropolyimide resin, a polyamide resin, a polyamidimide resin, a polyether imide resin, a cellulose acylate resin, a polyurethane resin, a polyether-ether ketone resin, a polycarbonate resin, an alicyclic polyolefin resin, a polyarylate resin, a polyether sulfone resin, a polysulfone resin, a cycloolefin copolymer, a fluorene ring-modified carbonate resin, an alicyclic-modified polycarbonate resin, an acryloyl compound or the like thermoplastic resin, as well as an acrylic resin, an epoxy resin or the like thermosetting or photocurable resin. In case where the light-emitting device or the display device is a bottom-emission-type one, then the resin film or the resin layer must be transparent. However, when it is a top-emission-type light-emitting device or display device, then the resin film or the resin layer may not be transparent.

Not specifically defined, the thickness of the resin film or the resin layer is preferably from 10 to 1000 μm, more preferably from 20 to 200 μm.

The resin film or the resin layer in the invention may have a circular-polarizing function or a light-diffusing function. Having the constitution, the light-emitting device or the display device may be further thinner, when it is a bottom-emission-type one. For imparting a circular-polarizing function or a light-diffusing function to the device, for example, the method described in JP-A 8-321381, 9-127885 and 7-142170 may be employed.

(Glass Substrate)

As the glass substrate in the invention, various glass substrates widely used in various display devices or light-emitting devices are employable in a broad range. In the invention, a glass substrate is combined with a resin film or a resin layer, whereby the glass substrate is hardly broken even when it is thinned. In particular, when a resin film or a resin layer is stuck to a glass substrate and then etched, the substrate is hardly broken during etching, and in addition, only one surface of the substrate can be etched and therefore the thickness unevenness of the glass substrate may be reduced. For example, in the invention, the thickness unevenness of the glass substrate may be at most 100 μm, and as the case may be, at most 50 μm. Preferably, the thickness unevenness is at most 50% of the mean thickness of the substrate.

The thickness of the glass substrate may be, for example, from 100 μm to 300 μm, and may further be from 100 to 200 μm.

(Gas-Barrier Film)

The gas barrier film of the invention is a film comprising a barrier layer having a function of blocking oxygen and moisture in air, and has an adhesive layer on the outermost surface the gas barrier film on the side having an organic region. The barrier layer of the invention may be any layer known to have a gas-barrier property and is preferably an organic/inorganic laminate-type gas barrier film having an organic region and an inorganic region or an organic layer and an inorganic layer that are alternately laminated. A film comprising a barrier layer having an organic region and an inorganic region or an organic layer and an inorganic layer may be referred to "organic/inorganic laminate-type gas barrier film".

The organic region and the inorganic region, or the organic layer and the inorganic layer are, in general, alternately laminated. When the film comprises an organic region and an inorganic region, it may be a graded material layer where the regions continuously change in the direction of the thickness of the film. Examples of the graded materials include the materials described in a report by Kim et al., in Journal of Vacuum Science and Technology A, Vol. 23, pp. 971-977 (2005 American Vacuum Society); and a continuous laminate of an organic layer and an inorganic layer with no interface therebetween as in USP-A 2004-46497. For simplifying the description hereinunder, the organic layer and the organic region are expressed as "organic layer" and the inorganic layer and the inorganic region are as "inorganic layer".

The number of the layers constituting the gas barrier film is not specifically defined, but typically, the film preferably comprises from 2 layers to 30 layers, more preferably from 3 layers to 20 layers. The barrier layer may be provided on only one surface of a plastic film or on both surfaces thereof.

(Substrate Film)

In the gas barrier film of the invention, a plastic film is in general used as the substrate film. The plastic film to be used is not particularly limited with respect to the material quality and thickness, etc. so far as it is a film capable of keeping a stacklaminate of an organic layer, an inorganic layer and the like and can be properly chosen depending upon the use purpose or the like. Specific examples of the plastic film include thermoplastic resins such as polyester resins, methacrylic resins, methacrylic acid-maleic acid copolymers, polystyrene resins, transparent fluorocarbon resins, polyimides, fluorinated polyimide resins, polyamide resins, polyamide-imide resins, polyetherimide resins, cellulose acylate resins, polyurethane resins, polyetheretherketone resins, polycarbonate resins, alicyclic polyolefin resins, polyarylate resins, polyethersulfone resins, polysulfone resins, cycloolefin copolymers, fluorene ring-modified polycarbonate resins, alicyclic modified polycarbonate resins, fluorene ring-modified polyester resins and acryloylated compounds.

The gas barrier film of the invention is preferable that the plastic film is composed of a raw material with heat resistance. Specifically, it is preferable that the plastic film is composed of a transparent raw material with high heat resistance having a glass transition temperature (Tg) of 100° C. or higher and/or a linear heat expansion coefficient of not more than 40 ppm/° C. The Tg and linear heat expansion coefficient can be adjusted by an additive or the like. Examples of such a thermoplastic resin include polyethylene naphthalate (PEN: 120° C.), polycarbonate (PC: 140° C.), alicyclic polyolefins (for example, ZEONOR 1600, manufactured by Zeon Corporation: 160° C.), polyarylate (PAr: 210° C.), polyethersulfone (PES: 220° C.), polysulfone (PSF: 190° C.), cycloolefin copolymers (COC: a compound described in Example 1 of JP-A-2001-150584: 162° C.), polyimides (for example, NEOPULIM, manufactured by Mitsubishi Gas Chemical Company, Inc.: 260° C.), fluorene ring-modified polycarbonate (BCF-PC, a compound described in JP-A-2000-227603: 225° C.), alicyclic modified polycarbonate (IP-PC, a compound described in JP-A-2000-227603: 205° C.) and acryloyl compound (a compound described in JP-A-2002-80616: 300° C. or higher) (the numerical figure in each of the parentheses indicates Tg). In particular, in the case where the transparency is required, it is preferable to use an alicyclic polyolefin or the like.

In the case where the gas barrier film of the invention is used in combination with a polarizing plate, it is preferable that the gas barrier layer surface of the gas barrier film is faced at the inside of a cell and is disposed in the innermost (adjacent to the device). At that time, since the gas barrier film is disposed in the inside of the cell relative to the polarizing plate, a retardation value of the gas barrier film is important. As to a use form of the gas barrier film in such an embodiment, it is preferable that a barrier film using a base material film having a retardation value of not more than 10 nm and a circular polarizing plate ((quarter-wave plate)+(half-wave plate)+(linear polarizing plate)) are stackedlaminated and used, or that a linear polarizing plate is combined with a gas barrier film using a base material film having a retardation value of from 100 nm to 180 nm, which can be used as a quarter-wave plate, and used.

Examples of the base material film having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

The gas barrier film of the invention must be transparent, namely its light transmittance is usually 80% or more, preferably 85% or more, and more preferably 90% or more. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas barrier film of the invention is used for display use, for example, when it is not disposed on the side of an observer, the transparency is not always required. Accordingly, in such case, an opaque material can also be used as the plastic film. Examples of the opaque material include known liquid crystal polymers such as polyimides and polyacrylonitrile.

The thickness of the plastic film to be used for the gas barrier film of the invention is properly chosen depending upon the use and therefore, is not particularly limited. It is typically from 1 to 800 μm, and preferably from 10 to 200 μm. These plastic films may have a functional layer such as a transparent conductive layer and a primer layer. The functional layer is described in detail in paragraphs 0036 to 0038 of JP-A-2006-289627. Examples of functional layers other than these layers include a matting agent layer, a passivation layer, an antistatic layer, a smoothening layer, an adhesion improving layer, a light shielding layer, an antireflection layer, a hard coat layer, a stress relaxing layer, an antifogging layer, an antifouling layer, a layer to be printed and an easily adhesive layer.

(Inorganic Layer)

The inorganic layer is, in general, a layer of a thin film formed of a metal compound. For forming the inorganic layer, employable is any method capable of producing the intended thin film. For it, for example, suitable is a coating method, sputtering method, a vacuum evaporation method, an ion-plating method or a plasma CVD method. Concretely, the methods described in Japanese Patent No. 3400324, JP-A 2002-322561, 2002-361774 are employable herein.

Not specifically defined, the component to be in the inorganic layer may be any one that satisfies the above-mentioned performance, for which, for example, employable are oxides, nitrides, carbides, oxinitrides, oxycarbides, nitrocarbides, oxynitrocarbaides containing at least one metal selected from Si, Al, In, Sn, Zn, Ti, Cu, Ce and Ta. Of those preferred are oxides, nitrides or oxinitrides of a metal selected from Si, Al, In, Sn, Zn and Ti; and more preferred are metal oxides, nitrides or oxinitrides with Si or Al. These may contain any other element as a subsidiary component.

Not specifically defined, the thickness of the inorganic layer is preferably within a range of from 5 nm to 500 nm, more preferably from 10 nm to 200 nm. Two or more inorganic layers may be laminated, and in such a case, the constitutive layers may have the same or different compositions. As described above, the composition of the inorganic layer may be continuously changed in a thickness direction of the film with no clear interface between the inorganic layer and an organic layer as in USP-A 2004-46497.

(Organic Layer)

In the invention, the organic layer is generally a polymer layer. The organic layer may be formed according to a polymer solution coating method, or according to an inorganic substance-containing hybrid coating method as in JP-A 2000-323273 and 2004-25732. As the case may be, a film of a polymer precursor (e.g., monomer) may be formed, and this may be polymerized to give a polymer layer.

In the invention, the organic layer preferably comprises a polymer formed through polymerization of a radical-polymerizable compound and/or an ether functional group-having cation-polymerizable compound.

(Polymerizable Compound)

The polymerizable compound for use in the invention is a compound having an ethylenic unsaturated bond at the terminal or in the side chain thereof, and/or a compound having epoxy or oxetane at the terminal or in the side chain thereof. Of those, preferred is a compound having an ethylenic unsaturated bond at the terminal or in the side chain thereof. Examples of the compound having an ethylenic unsaturated bond at the terminal or in the side chain thereof include (meth)acrylate compounds (acrylate and methacrylate are expressed as (meth)acrylate as combined), acrylamide compounds, styrene compound, maleic anhydride, etc.

As (meth)acrylate compounds, preferred are (meth)acrylates, urethane-(meth)acrylates, polyester-(meth)acrylates, epoxy(meth)acrylates, etc.

As styrene compounds, preferred are styrene, α-methylstyrene, 4-methylstyrene, divinylbenzene, 4-hydroxystyrene, 4-carboxystyrene, etc.

Specific examples of (meth)acrylate compounds are mentioned below, to which, however, the invention should not be limited.

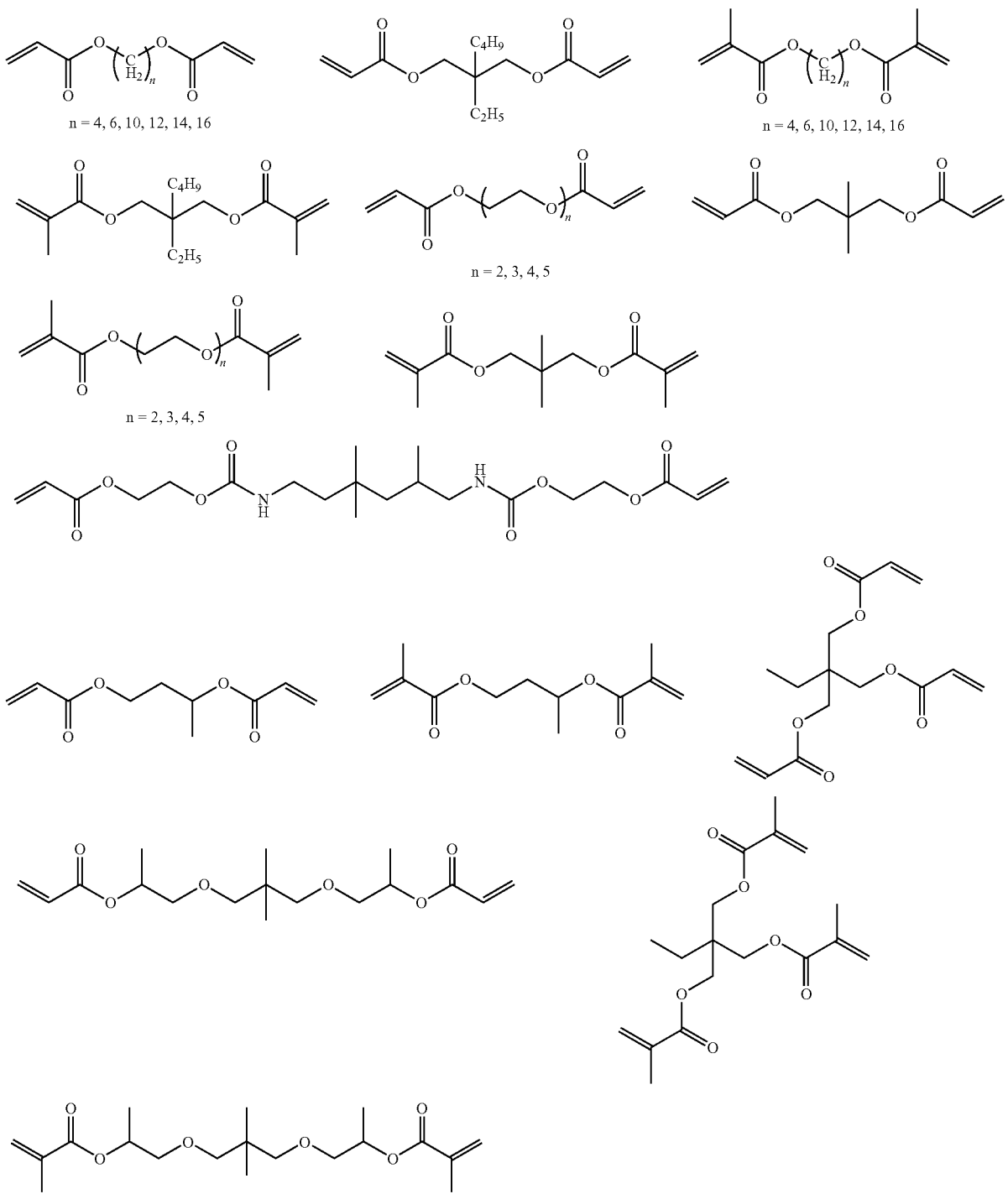

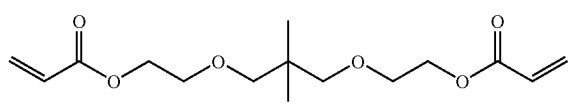
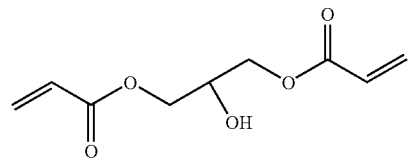
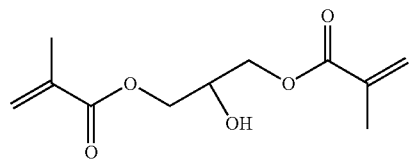
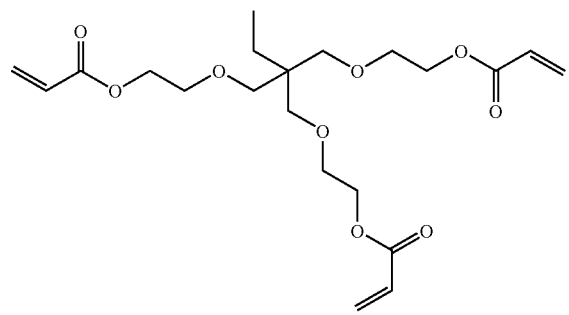
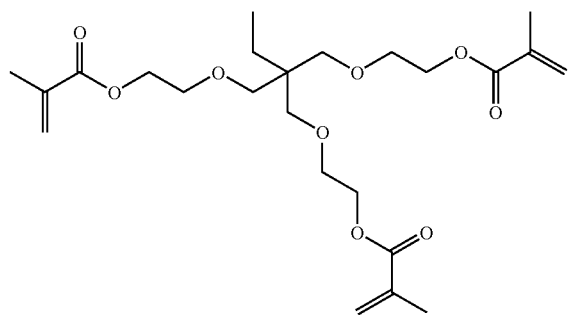
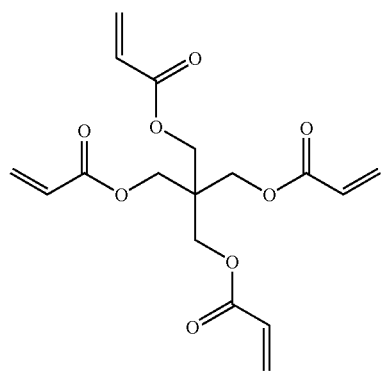

-continued
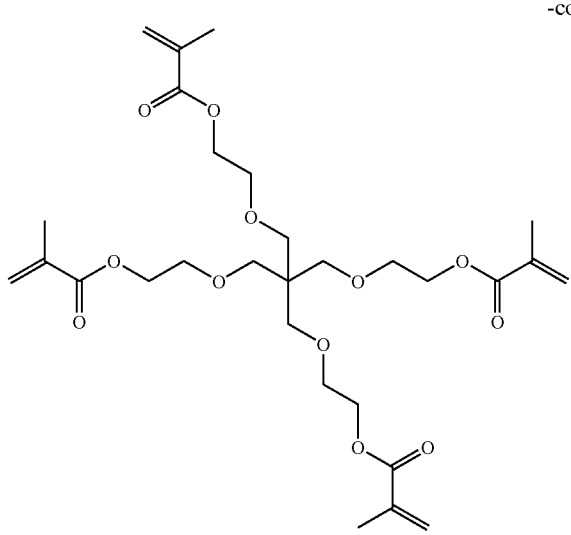
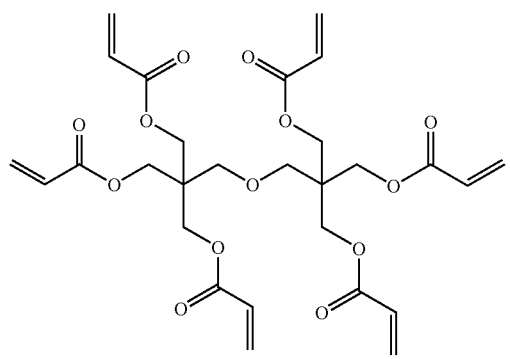
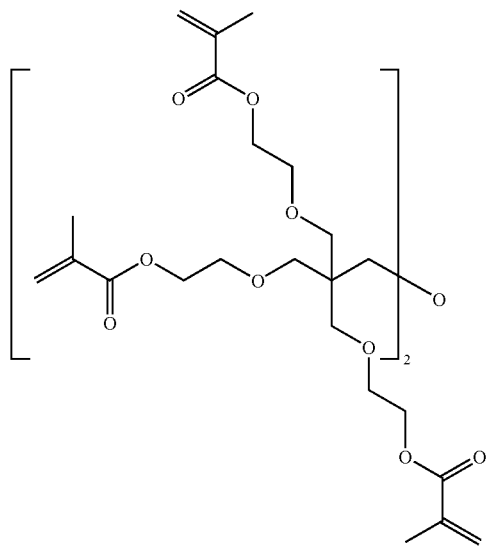

-continued
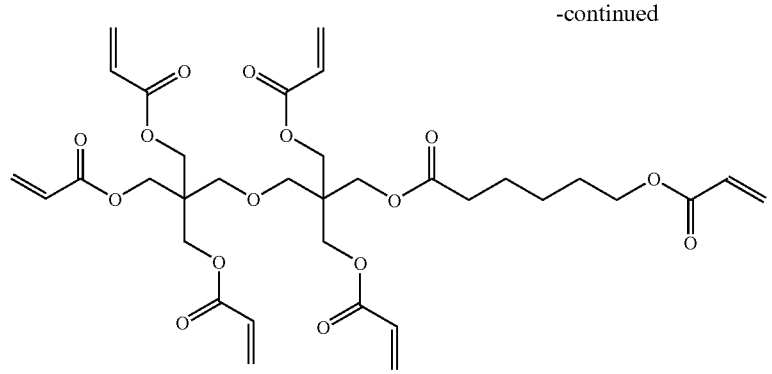
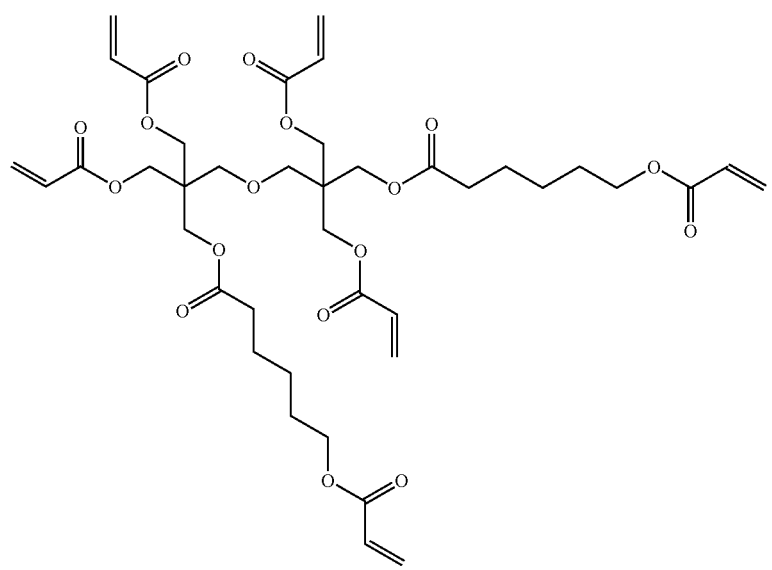
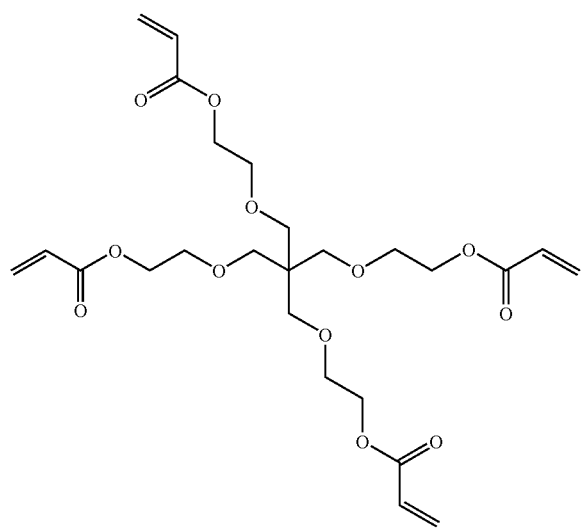

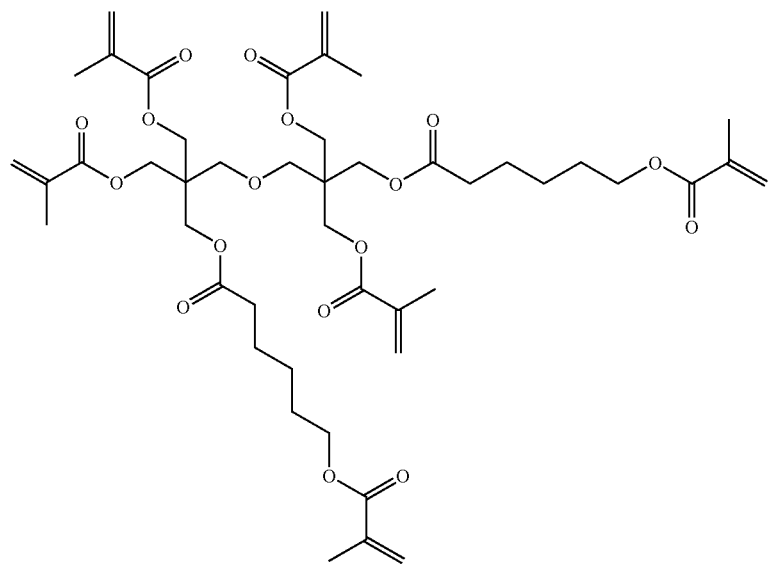
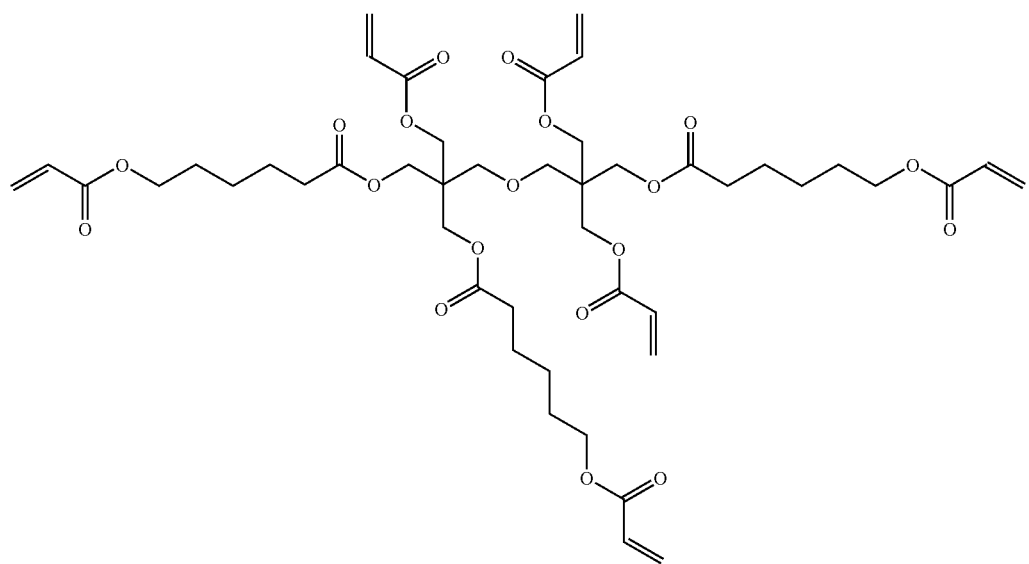
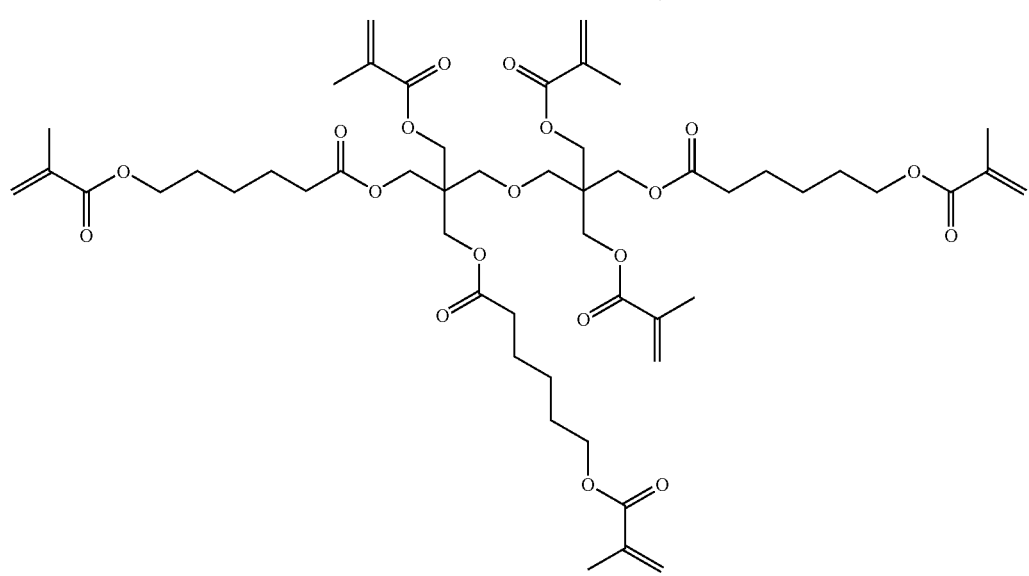

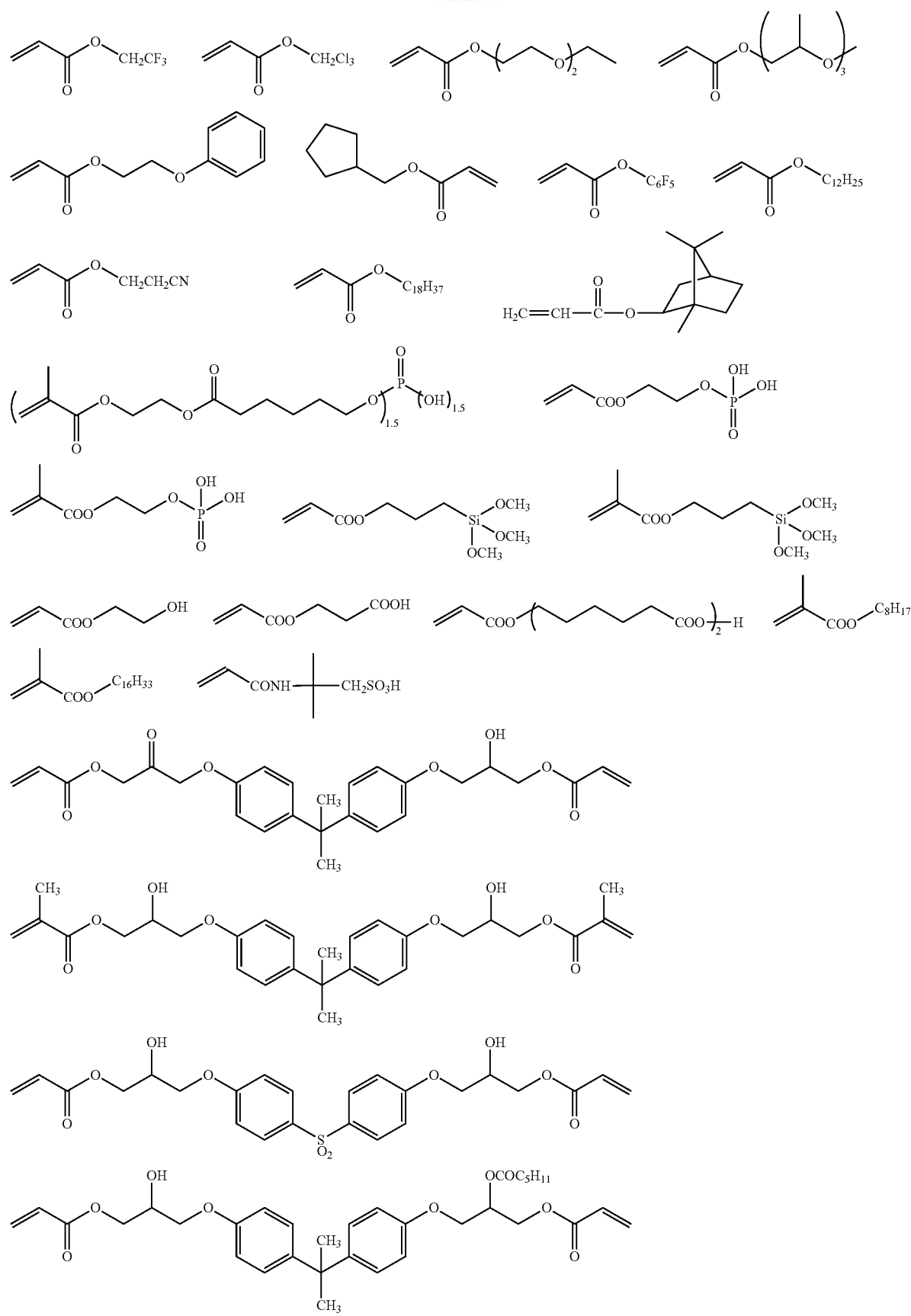

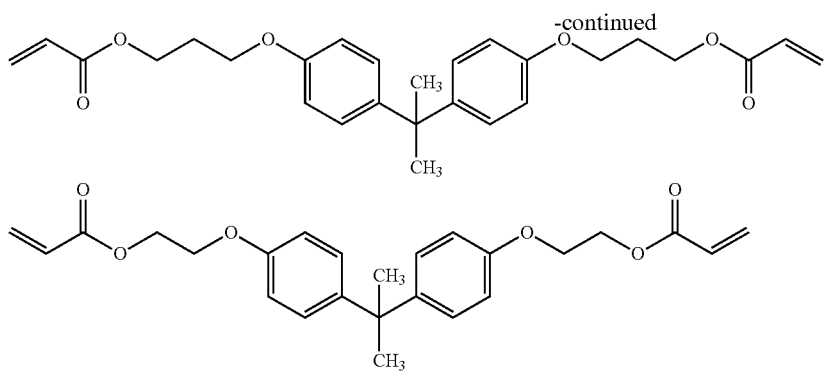

Apart from the above-mentioned compounds, for example, the compounds described in U.S. Pat. Nos. 6,083,628 and 6,214,422 are also preferably used.

Preferably, the organic layer is smooth and has a high film hardness. Regarding the smoothness of the organic layer, the mean roughness of the layer of 10 μm square (Ra value) is preferably at most 10 nm, more preferably at most 2 nm. The pencil hardness of the organic layer is preferably at least HB, more preferably at least H.

The thickness of the organic layer is not specifically defined. When too thin, however, the layer could hardly have a uniform thickness; and when too thick, the layer may be cracked by external force and its barrier properties may be thereby worsened. From these viewpoints, the thickness of the organic layer is preferably from 10 nm to 2000 nm, more preferably from 100 nm to 1000 nm.

Examples of the formation method of the organic layer include usual solution coating method and vacuum fabrication method. As the solution coating method, the solution can be coated by, for example, a dip coating method, an air knife coating method, a curtain coating method, a roller coating method, a wire bar coating method, a gravure coating method, a slide coating method or an extrusion coating method using a hopper described in U.S. Pat. No. 2,681,294. Though the vacuum fabrication method is not particularly limited, film formation methods such as vapor deposition method and plasma CVD method.

Though the monomer polymerization method is not particularly limited, heat polymerization, photo (ultraviolet ray or visible light) polymerization, electron beam polymerization, plasma polymerization or a combination thereof is preferably employed. In the case where heat polymerization is carried out, the plastic film used as a substrate must be heat resistant to an appropriate extent. The glass transition temperature (Tg) of the plastic film is required to be higher than the heating temperature.

In the case where photopolymerization is carried out, a photopolymerization initiator is used in combination. Examples of the photopolymerization initiator include IRGACURE series (for example, IRGACURE 651, IRGACURE 754, IRGACURE 184, IRGACURE 2959, IRGACURE 907, IRGACURE 369, IRGACURE 379 AND IRGACURE 819), DAROCURE series (for example, DAROCURE TPO and DAROCURE 1173) and QAUNTACURE PDO, all of which are marketed by Ciba Specialty Chemicals; and EZACURE series (for example, EZACURE TZM and EZACURE TZT) which are marketed by Sartomer Company.

The light to be irradiated is usually an ultraviolet ray to be emitted from a high pressure mercury vapor lamp or a low pressure mercury vapor lamp. The irradiation energy is preferably 0.5 J/cm$^2$ or more, and more preferably 2 J/cm$^2$ or more. Since the acrylate or methacrylate is affected by polymerization inhibition due to oxygen in air, it is preferable to reduce the oxygen concentration or oxygen partial pressure at the time of polymerization. In the case of reducing the oxygen concentration at the time of polymerization by a nitrogen purge method, the oxygen concentration is preferably not more than 2%, and more preferably not more than 0.5%. In the case of reducing the oxygen partial pressure at the time of polymerization by a pressure reducing method, the total pressure is preferably not more than 1,000 Pa, and more preferably not more than 100 Pa. Also, it is especially preferable to carry out ultraviolet ray polymerization upon irradiation with energy of 2 J/cm$^2$ or more under a reduced pressure condition of not more than 100 Pa.

The polymerization degree of the monomer is preferably 80% or more, more preferably 85% or more, still more preferably 90% or more. The "polymerization degree" used here means the percentage of reacted polymerizable groups out of all polymerizable groups (acryloyl group and methacryloyl group) in the monomer mixture.

(Adhesive Layer)

The adhesive layer is a layer comprising an adhesive as the main ingredient thereof. In general, at least 70% by weight of the adhesive layer is an adhesive, and preferably from 80 to 90% by weight of the adhesive layer is an adhesive.

As the adhesive, any one widely used for light-emitting devices and display devices is employable herein in a broad range. Preferred is an epoxy-based adhesive. The epoxy-based adhesive includes a thermosetting adhesive and a UV-curable adhesive. In case where the gas-barrier film absorbs UV rays, the adhesive is preferably a thermosetting one. The thermosetting adhesive includes a one-component adhesive and a two-component adhesive, and both of these are preferred for use in the invention. In the invention, the adhesive can be colorless and transparent after cured. Commercial products of the adhesive usable herein are Diazo-Nichimori's Epotec series, Nagase ChemteX's XNR-5000 series, and Three Bond's 3000 series.

An adhesive layer-having gas-barrier film prepared by providing an adhesive layer on the surface of a gas-barrier film may also be used herein. Use of the gas-barrier film of the type is advantageous in that the production process may be more simplified.

Not specifically defined, the thickness of the adhesive layer is preferably within a range of from 2 to 100 μm, more preferably from 5 to 20 μm.

(Planar Layer)

The planar layer is for planarizing the surface of the device, and it facilitates the lamination of the next layer thereon. As the planar layer, any one known for use in light-emitting devices and display devices can be employed herein. For example, the layer may be provided according to the method of forming a primer coat layer described in JP-A 2003-251731, paragraph [0011].

Not specifically defined, the thickness of the planar layer is preferably within a range of from 0.5 to 10 μm.

<<Display Device and Light-Emitting Device>>

The display device and the light-emitting device of the invention include liquid-crystal display devices, organic EL devices, inorganic EL devices, fluorescent display devices, etc.

<Liquid Crystal Display Device>

The reflection type liquid crystal display device is configured to include a lower substrate, a reflection electrode, a lower alignment film, a liquid crystal layer, an upper alignment film, a transparent electrode, an upper substrate, a λ/4 plate and a polarizing film in order from the lower side. In the case of giving a color displaying function to the reflection type liquid crystal display device, it is preferable to further provide a color filter layer between the reflection electrode and the lower alignment film or between the upper alignment film and the transparent electrode.

Also, the transmission type liquid crystal display device is configured to include a backlight, a polarizing plate, a λ/4 plate, a lower transparent electrode, a lower alignment film, a liquid crystal layer, an upper alignment film, an upper transparent electrode, an upper substrate, a λ/4 plate and a polarizing plate in order from the lower side. Also, in the case of giving a color displaying function to the transmission type liquid crystal display device, it is preferable to further provide a color filter layer between the lower transparent electrode and the lower alignment film or between the upper alignment film and the upper transparent electrode.

Though the structure of the liquid crystal layer is not particularly limited, it is preferably of, for example, a TN (twisted nematic) type, an STN (super twisted nematic) type, an HAN (hybrid aligned nematic) type, a VA (vertically alignment) type, an ECB (electrically controlled birefringence) type, an OCB (optically compensated bend) type, a CPA (continuous pinwheel alignment) type or an IPS (in-plane switching) type.

<Touch Panel>

As the touch panel, one obtained by applying the gas barrier film of the invention onto a substrate described in, for example, JP-A-5-127822 or JP-A-2002-48913 can be used.

<Organic EL Device>

An "organic EL device" means an organic electroluminescent device. The organic EL device has a cathode and an anode on the side of a substrate other than the side having a resin film or a resin layer, and has an organic compound layer including an organic light-emitting layer between the both electrodes. In view of properties of the light-emitting device, it is preferable that at least one electrode of the anode and the cathode is transparent.

In the invention, an embodiment of the laminate of the organic compound layer is preferably an embodiment in which a hole transport layer, a light-emitting layer and an electron transport layer are laminated in order from the anode side. Furthermore, a charge blocking layer may be provided between the hole transport layer and the light-emitting layer or between the light-emitting layer and the electron transport layer. A hole injection layer may be provided between the anode and the hole transport layer; and an electron injection layer may be provided between the cathode and the electron transport layer. The light-emitting layer may comprise only one layer, or may be divided into a first light-emitting layer, a second light-emitting layer, and a third light-emitting layer, and the like. Each of the layers may be divided into plural secondary layers.

(Anode)

In general, the anode may have a function as an electrode capable of supplying a hole into the organic compound layer and is not particularly limited as to its shape, structure and size or the like. The anode can be properly chosen among known electrode materials depending upon the use and purpose of the light-emitting device. As described previously, the anode is usually provided as a transparent anode. The transparent anode is described in detail in *New Developments of Transparent Conducting Films*, supervised by SAWADA, Yutaka (published by CMC Publishing Co., Ltd., 1999). In the case of using a plastic base material with low heat resistance, a transparent anode obtained through fabrication at a low temperature of not higher than 150° C. using ITO or IZO is preferable.

(Cathode)

In general, the cathode may have a function as an electrode capable of injecting an electron into the organic compound layer and is not particularly limited as to its shape, structure and size or the like. The cathode can be properly chosen among known electrode materials depending upon the use and purpose of the light-emitting device.

As materials constituting the cathode, for example, metals, alloys, metal oxides, electric conductive materials or mixtures thereof can be exemplified. Specific examples thereof include alkaline earth metals (for example, Mg and Ca), gold, silver, lead, aluminum, a sodium-potassium alloy, a lithium-aluminum alloy, a magnesium-silver alloy, indium and rare earth metals (for example, ytterbium). Though these materials may be used singly, from the standpoint of making stability and electron injection properties compatible with each other, two or more kinds of these materials can be favorably used in combination.

Of these, the material constituting the cathode is preferably a material composed mainly of aluminum.

The material composed mainly of aluminum refers to aluminum alone or an alloy of aluminum and from 0.01 to 10% by mass of an alkali metal or an alkaline earth metal or a mixture thereof (for example, a lithium-aluminum alloy and a magnesium-aluminum alloy). The cathode material is described in detail in JP-A-2-15595 and JP-A-5-121172. Also, a dielectric layer composed of a fluoride or oxide of an alkali metal or alkaline earth metal or the like may be inserted in a thickness of from 0.1 to 5 nm between the cathode and the organic compound layer. This dielectric layer can be considered as a certain kind of the electron injection layer.

The thickness of the cathode can be properly chosen depending upon the material constituting the cathode and cannot be unequivocally defined. However, the thickness of the cathode is in general from about 10 nm to 5 μm, and preferably from 50 nm to 1 μm.

Also, the cathode may be transparent or opaque. The transparent cathode can be formed by thinly fabricating the cathode material in a thickness of from 1 to 10 nm and further laminating a transparent conductive material such as ITO and IZO thereon.

(Organic Compound Layer)

The organic electroluminescent device of the invention has at least one organic compound layer including a light-emitting layer. As described previously, examples of other organic compound layers than the organic light-emitting layer include respective layers such as a hole transport layer, an electron transport layer, a charge blocking layer, a hole injection layer and an electron injection layer.

((Organic Light-Emitting Layer))

The organic light-emitting layer is a layer having a function such that at the time of application of an electric field, it receives a hole from the anode, the hole injection layer or the hole transport layer and receives an electron from the cathode, the electron injection layer or the electron transport layer to provide a field of recombination of the hole and the electron, thereby achieving light emission. The light-emitting layer may be constituted of only a light-emitting material or may be configured as a mixed layer of a host material and a light-emitting material. The light-emitting material may be a fluorescent light-emitting material or a phosphorescent light-emitting material; and a dopant may be a single material or a combination of two or more kinds of materials. The host material is preferably a charge transport material. The host material may be a single material or a combination of two or more kinds of materials, and examples thereof include a constitution of a mixture of an electron transporting host material and a hole transporting host material. Furthermore, the light-emitting layer may contain a material which does not have charge transporting properties and does not emit light. Also, the light-emitting layer may be a single layer or may be configured of two or more layers, and the respective layers may emit light in a different luminescent color.

Examples of the fluorescent light-emitting material which can be used in the invention include compounds, for example, benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perynone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, various metal complexes represented by metal complexes of 8-quinolinol derivatives and pyrromethene derivatives, polymer compounds (for example, polythiophene, polyphenylene and polyphenylenevinylene) and organosilane derivatives.

Examples of the phosphorescent light-emitting material include complexes containing a transition metal atom or a lanthanoid atom.

The transition metal atom is not particularly limited, and preferred examples thereof include ruthenium, rhodium, palladium, tungsten, rhenium, osmium, iridium and platinum, with rhenium, iridium and platinum being more preferable.

Examples of the lanthanoid atom include lanthanum, cerium, praseodymium, neodymium, samarium, europium, gadolinium, terbium, dysprosium, holmium, erbium, thulium, ytterbium and lutetium. Of these lanthanoid atoms, neodymium, europium and gadolinium are preferable.

Examples of a ligand of the complex include ligands described in G. Wilkinson, et al., *Comprehensive Coordination Chemistry*, published by Pergamon Press, 1987; H. Yersin, *Photochemistry and Photophysics of Coordination Compounds*, published by Springer-Verlag, 1987; and YAMAMOTO, Akio, *Organometallic Chemistry—Principles and Applications*, published by Shokabo Publishing Co., Ltd., 1982.

Also, examples of the host material which is contained in the light-emitting layer in the invention include materials as enumerated in the following paragraphs of hole injection layer, hole transport layer, electron injection layer and electron transport layer as well as a material having a carbazole skeleton, a material having a diarylamine skeleton, a material having a pyridine skeleton, a material having a pyrazine skeleton, a material having a triazine skeleton and a material having an arylsilane skeleton.

((Hole Injection Layer and Hole Transport Layer))

The hole injection layer and the hole transport layer are each a layer having a function to receive a hole from the anode or the anode side to transport it into the cathode side. Specifically, the hole injection layer and the hole transport layer are each preferably a layer containing a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene based compound, a porphyrin based compound, an organosilane derivative, carbon or the like.

((Electron Injection Layer and Electron Transport Layer))

The electron injection layer and the electron transport layer are each a layer having a function to receive an electron from the cathode or the cathode side to transport it into the anode side. Specifically, the electron injection layer and the electron transport layer are each preferably a layer containing a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, aromatic ring tetracarboxylic acid anhydrides of naphthalene, perylene, etc., a phthalocyanine derivative, a metal complex of every kind represented by metal complexes of 8-quinolinol derivatives and metal complexes composed of, as a ligand, metal phthalocyanine, benzoxazole or benzothiazole, an organosilane derivative or the like.

((Hole Blocking Layer))

The hole blocking layer is a layer having a function to prevent a phenomenon in which the hole which has been transported into the light-emitting layer from the anode side passes through into the cathode side from occurring. In the invention, the hole blocking layer can be provided as an organic compound layer which is positioned adjacent to the light-emitting layer on the cathode side.

Examples of an organic compound constituting the hole blocking layer include aluminum complexes such as BAlq, triazole derivatives and phenanthroline derivatives such as BCP. Also, a layer having a function to prevent a phenomenon in which the electron which has been transported into the light-emitting layer from the cathode side passes through into the anode side from occurring may be provided on the position adjacent to the light-emitting layer on the anode side. The hole injection layer and hole transport layer may serve this function.

<TFT Display Device>

The barrier laminate of the invention can be used as a substrate for image display device of a thin film transistor to produce a TFT. The method described in JP-T 10-512104 and others can be used as a method for producing TFT array. The substrate may also have a color filter for color display. The color filter can be produced by any methods. Photography can be used preferably.

<Solar Cell>

The barrier laminate of the invention can be used also as a sealing film for solar cell devices. Preferably, the barrier laminate of the invention is used for sealing a solar cell device in such a manner that its adhesive layer is on the side near to the solar cell device. The solar cell devices for which the barrier laminate of the invention is favorably used are not specifically defined. For example, they include single crystal silicon-based solar cell devices, polycrystalline silicon-based solar cell devices, single-junction or tandem-structure amorphous silicon-based solar cell devices, gallium-arsenic (GaAs), indium-phosphorus (InP) or the like III-V Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices, dye-sensitized solar cell devices, organic solar cell devices, etc. Above all, in the invention, the solar cell devices are preferably copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices.

EXAMPLES

The invention is described more concretely with reference to the following Examples. In the following Examples, the material used, its amount and the ratio, the details of the treatment and the treatment process may be suitably modified or changed not overstepping the spirit and the scope of the invention. Accordingly, the invention should not be limited to these Examples.

<Preparation of Gas-Barrier Film>

Gas-barrier films having an inorganic layer and an organic layer provided on a substrate film (samples Nos. 101 to 103) were produced according to the process mentioned below. The details of the constitution of each gas-barrier film are shown in Table 1. The substrate film is a polyethylene naphthalate film (PEN, Teijin-Dupont's Q65A having a thickness of 100 µM).

[1] Formation of Inorganic Layer (X):

Using a reactive sputtering apparatus, an inorganic layer of aluminum oxide was formed. The concrete film formation condition is shown below.

The pressure in the vacuum chamber of the reactive sputtering apparatus was reduced to an ultimate vacuum degree of $5 \times 10^{-4}$ Pa, using an oil rotatory pump and a turbomolecular pump. Next, argon was introduced into it as a plasma gas; and a power of 2000 W was applied to it from a plasma source. A high-purity oxygen gas was introduced into the chamber, and the film formation pressure was controlled at 0.3 Pa for a predetermined period of time to form an inorganic layer of aluminum oxide. Thus formed, the aluminum oxide film had a thickness of 40 nm and a film density of 3.01 $g/cm^3$.

[2] Formation of Organic Layer (Y, Z):

The organic layer was formed according to two methods of a solution-coating film formation method under normal pressure (organic layer Y) and a flash vapor deposition method under reduced pressure (organic layer Z). The details of film formation are shown below.

Formation of Organic Layer (Y):

9 g of a photopolymerizing acrylate, tripropylene glycol diacrylate (TPGDA, by Daicel Sytec) and 0.1 g of a photopolymerization initiator (Ciba Specialty Chemicals' Irgacure 907) were dissolved in 190 g of methyl ethyl ketone to prepare a coating solution. The coating solution was applied onto a substrate film, using a wire bar, and then irradiated with UV rays at an illuminance of 350 $mW/cm^2$ and at a radiation dose of 500 $mJ/cm^2$, using an air-cooling metal halide lamp of 160 W/cm (by Eyegraphics) with nitrogen purging to an oxygen concentration of at most 0.1%, thereby forming an organic layer (Y). The film thickness was about 500 nm.

Formation of Organic Layer (Z):

9.7 g of a photopolymerizing acrylate, butylethylpropanediol diacrylate (BEPGA, by Kyoei Chemical) and 0.3 g of a photopolymerization initiator (Lambertispa's EZA-CURE-TZT) were mixed to prepare a vapor deposition liquid. The vapor deposition liquid was applied onto a substrate for vapor deposition thereon, according to a flash vapor deposition method under a condition of inner pressure of 3 Pa in the vacuum chamber. Next, under the same vacuum degree condition, this was irradiated with UV rays at a radiation dose of 2 $J/cm^2$, thereby forming an organic layer (Z). The film thickness was about 1200 nm. For forming the organic layer (Z), used was an organic/inorganic laminate film formation device, Guardian 200 (by Vitex Systems).

[3] Production of Gas-Barrier Film:

Gas-barrier films were produced by forming the above-mentioned inorganic layer and organic layer in order on a substrate film according to the constitution of the samples shown in Table 1. The films were produced according to the following two methods.

[3-1] Method of Repeating Organic Layer Formation by Solution Coating and Inorganic Layer Formation Under Reduced Pressure (Lamination A):

An organic layer and an inorganic layer were alternately laminated on a substrate. An inorganic layer was laminated on an organic layer as follows: An organic layer was first formed by solution coating, and then this was put into a vacuum chamber, in which the pressure was reduced to a vacuum degree of at most $10^{-3}$ Pa. This was kept in the chamber for a predetermined period of time, and then an inorganic layer was formed on it. An organic layer was laminated on the inorganic layer as follows: Immediately after the formation of the inorganic layer, an organic layer was formed thereon according to a solution coating method.

[3-2] Method of Continuous Formation of Organic Layer and Inorganic Layer Under Reduced Pressure (Lamination B):

Using the above-mentioned organic/inorganic laminate film formation apparatus, Guardian 200, an organic layer and an inorganic layer were laminated. In this apparatus, both the organic layer and the inorganic layer are formed in a reduced pressure environment, and the film formation chambers for organic layer and inorganic layer are connected to each other. In this, therefore, the two layers could be continuously formed in a reduced pressure environment. Accordingly, the film is not exposed to air until the completion of barrier film formation.

TABLE 1

| Sample No. | Layer Constitution | Lamination Method |
|---|---|---|
| 101 | PEN/Y/X/Y/X/Y/X/YX/Y | Lamination A |
| 102 | PEN/Z/X/Z/X/Z/X/ZX/Z | Lamination B |
| 103 | PEN/Y/X/Z/X/Z/X/ZX/Z | Lamination B |

<Production of Organic EL Device>

Comparative Example 1

[1] Preparation of Bottom-Emission-Type Organic EL Device Substrate:

An ITO film-having conductive glass substrate (surface resistivity, 10 Ω/square) was washed with 2-propanol, and then processed for UV ozone treatment for 10 minutes. On the substrate (anode), the following organic compound layers were formed in order by vapor deposition according to a vacuum vapor deposition method.
(First Hole Transportation Layer)
Copper phthalocyanine: film thickness 10 nm.
(Second Hole Transportation Layer)
N,N'-diphenyl-N,N'-dinaphthylbenzidine: film thickness 40 nm.
(Light-Emitting Layer Also Serving as Electron Transportation Layer)
Tris(8-hydroxyquinolinato)aluminum: film thickness 60 nm.

Finally, 1 nm of lithium fluoride and 100 nm of metal aluminum were formed in order by vapor deposition, thereby forming a cathode; and a silicon nitride film having a thickness of 3 μm was formed on it according to a parallel plate CVD method, thereby constructing an organic EL device.

[2] Application of Gas-Barrier Film on Organic EL Device:

Using a thermosetting adhesive (Epotec 310, by Daizo-Nichimori), the gas-barrier film produced and the organic EL device substrate were stuck together in such a manner that the gas-barrier layer of the film could be on the side of the organic EL device, and heated at 65° C. for 3 hours to cure the adhesive. 20 test pieces of every sample of the thus-sealed organic EL device (samples Nos. 201 to 203) were prepared.

Comparative Example 2

[1] Preparation of Top-Emission-Type Organic EL Device Substrate:

An ITO film-having conductive glass substrate (surface resistivity, 10 Ω/square) was washed with 2-propanol, and then processed for UV ozone treatment for 10 minutes. On the substrate (anode), the following organic compound layers were formed in order by vapor deposition according to a vacuum vapor deposition method.
(First Hole Transportation Layer)
Copper phthalocyanine: film thickness 10 nm.
(Second Hole Transportation Layer)
N,N'-diphenyl-N,N'-dinaphthylbenzidine: film thickness 40 nm.
(Light-Emitting Layer Also Serving as Electron Transportation Layer)
Tris(8-hydroxyquinolinato)aluminum: film thickness 60 nm.
(Electron Injection Layer)
Lithium fluoride: film thickness 1 nm.
(Transparent Cathode and Protective Layer)
A silver layer having a film thickness 10 nm and an ITO layer having a thickness of 100 nm were formed in order by vapor deposition to be a transparent cathode, and on this, a silicon nitride film having a thickness of 3 μm was formed according to a parallel plate CVD method, thereby constructing an organic EL device.

[2] Application of Gas-Barrier Film on Organic EL Device:

In the same manner as in Comparative Example 1, the gas-barrier film produced and the organic EL device substrate were stuck together, thereby producing 20 test pieces of every organic EL device (samples Nos. 301 to 303).

Example 1

In the same manner as in Comparative Example 1, 20 test pieces of every organic EL device (samples Nos. 401 to 403) were produced, in which, however, the glass substrate was changed to the substrate mentioned below.
Preparation of Substrate:

A glass substrate (thickness, 400 μm) and a polyethylene naphthalate (PEN, Teijin-DuPont's Q65A having a thickness of 100 μm) film were stuck together with a thermosetting adhesive (Daizo-Nichimori's Epotec 310), and heated at 65° C. for 3 hours to cure the adhesive. The obtained PEN film/glass substrate laminate was dipped in a hydrofluoric acid solution, and pulled up when the glass was etched to a depth of about 200 μm.

Example 2

In the same manner as in Comparative Example 1, 20 test pieces of every organic EL device (samples Nos. 501 to 503) were produced, in which, however, the glass substrate was changed to the substrate mentioned below.
Preparation of Substrate:

An epoxy resin was applied onto a glass substrate (thickness, 400 μm) to form a coating layer having a thickness of 0.1 mm thereon, and then heated at 150° C. for 1 hour to cure the resin. The obtained epoxy resin layer/glass substrate laminate was dipped in a hydrofluoric acid solution, and pulled up when the glass was etched to a depth of about 200 μm.

Example 3

In the same manner as in Comparative Example 2, 20 test pieces of every organic EL device (samples Nos. 601 to 603) were produced, in which, however, the glass substrate was changed to the same substrate as that used in Example 1.

Example 4

In the same manner as in Comparative Example 2, 20 test pieces of every organic EL device (samples Nos. 701 to 703) were produced, in which, however, the glass substrate was changed to the same substrate as that used in Example 2.

Example 5

In the same manner as in Comparative Example 1, 20 test pieces of every organic EL device (samples Nos. 801 to 803) were produced, in which, however, the glass substrate was changed to the substrate mentioned below.
Preparation of Substrate:

A glass substrate (thickness, 400 μm) and a circular-polarizing film (thickness, 280 μm; produced by Mikan Imaging) were stuck together with a thermosetting adhesive (Daizo-Nichimori's Epotec 310), and heated at 65° C. for 3 hours to cure the adhesive. The obtained circular-polarizing film/glass substrate laminate was dipped in a hydrofluoric acid solution, and pulled up when the glass was etched to a depth of about 200 μm.

Example 6

In the same manner as in Comparative Example 1, 20 test pieces of every organic EL device (samples Nos. 901 to 903) were produced, in which, however, the glass substrate was changed to the substrate mentioned below.
Preparation of Substrate:
A glass substrate (thickness, 400 μm) and a light-diffusing film (FUJIFILM's UA film having a thickness of 100 μm) were stuck together with a thermosetting adhesive (Daizo-Nichimori's Epotec 310), and heated at 65° C. for 3 hours to cure the adhesive. The obtained light-diffusing film/glass substrate laminate was dipped in a hydrofluoric acid solution, and pulled up when the glass was etched to a depth of about 200 μm.

Test Example 1

The samples cut into a size of 2 cm square were dropped down onto an concrete floor from a height of 50 cm, and checked as to whether the glass part of each sample was broken. In the organic EL devices of Comparative Examples 1 and 2, the glass was broken; but in the organic EL devices of Examples 1 to 6, the glass was not broken.

Test Example 2

The organic EL devices of Comparative Examples 1 and 2 and Examples 1 to 6 were analyzed for the thickness unevenness according to the method mentioned below. As a result, it was confirmed that the thickness unevenness of the organic EL devices of Comparative Examples 1 and 2 was 100 μm or more, but the thickness unevenness of the organic EL devices of Examples 1 to 6 was at most 50 μm.
Method for Determination of Thickness Unevenness:
The difference between the mean thickness at four corners (each at a point of 0.1 mm from every corner on the diagonals of the organic EL device) of each organic EL device sample having a size of 2 cm square and the thickness of the device at the point where the two diagonals cross is taken as a thickness unevenness of the tested device.

The acrylate used in the organic layers was changed to the above-mentioned bisphenol acrylate compound, and the device samples also had the same effects.

The production method of the invention is advantageous in that the handlability in producing devices by manufacturers is improved and the product yield is increased.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 242716/2007 filed on Sep. 19, 2007 and Japanese Patent Application No. 134080/2008 filed on May 22, 2008, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for producing a light-emitting device comprising a resin film, a glass substrate, a light-emitting element laminate or a display element laminate, and a gas-barrier film in that order, the method comprising:
   sticking the resin film and the glass substrate together;
   etching a part of the glass substrate; and
   providing the light-emitting element laminate or the display element laminate on the glass substrate after etching,
   wherein the gas barrier film has at least one organic region and at least one inorganic region on a substrate film.

* * * * *